(12) United States Patent
Fan et al.

(10) Patent No.: US 12,402,283 B2
(45) Date of Patent: Aug. 26, 2025

(54) LIQUID COOLING DEVICE

(71) Applicant: Auras Technology Co., Ltd., New Taipei (TW)

(72) Inventors: Mu-Shu Fan, New Taipei (TW); Chien-Chih Su, New Taipei (TW); Hsing-Pao Yu, New Taipei (TW); Chia-Chen Wang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 415 days.

(21) Appl. No.: 17/974,277

(22) Filed: Oct. 26, 2022

(65) Prior Publication Data

US 2023/0156958 A1  May 18, 2023

Related U.S. Application Data

(60) Provisional application No. 63/280,870, filed on Nov. 18, 2021, provisional application No. 63/303,263, filed on Jan. 26, 2022.

(51) Int. Cl.
*H05K 7/20* (2006.01)
*G06F 1/20* (2006.01)

(52) U.S. Cl.
CPC .......... *H05K 7/2039* (2013.01); *G06F 1/206* (2013.01); *H05K 7/20136* (2013.01); *H05K 7/20254* (2013.01); *H05K 7/20263* (2013.01); *H05K 7/20272* (2013.01)

(58) Field of Classification Search
CPC .. F28F 2250/08; G06F 1/206; H05K 7/20136; H05K 7/20218; H05K 7/20254; H05K 7/20263; H05K 7/20272; H05K 7/2039; H05K 7/20445; H05K 5/0217
See application file for complete search history.

(56) References Cited

U.S. PATENT DOCUMENTS

| | | | | |
|---|---|---|---|---|
| 7,466,550 B2* | 12/2008 | Yeh | ........................ | H01L 23/467 |
| | | | | 257/E23.098 |
| 10,874,034 B1* | 12/2020 | Chen | ...................... | H01L 23/473 |
| 10,917,995 B2* | 2/2021 | Tokeshi | .................. | F28D 15/00 |
| 2006/0011332 A1* | 1/2006 | Inoue | ................. | H05K 7/20272 |
| | | | | 165/166 |
| 2006/0185378 A1* | 8/2006 | Duan | ................. | H05K 7/20263 |
| | | | | 62/259.2 |
| 2007/0034359 A1* | 2/2007 | Liu | ..................... | F28D 1/05366 |
| | | | | 165/104.31 |
| 2014/0071624 A1* | 3/2014 | Aoki | ....................... | H01L 23/34 |
| | | | | 165/104.31 |
| 2017/0257979 A1* | 9/2017 | Wu | ......................... | H01L 23/473 |
| 2018/0195804 A1* | 7/2018 | Mai | ............................ | G06F 1/20 |
| 2019/0075681 A1* | 3/2019 | Xiao | ........................ | F28F 1/126 |
| 2019/0090384 A1* | 3/2019 | Xiao | ........................ | F28F 1/126 |

(Continued)

*Primary Examiner* — Eric S Ruppert
*Assistant Examiner* — Hans R Weiland
(74) *Attorney, Agent, or Firm* — MUNCY, GEISSLER, OLDS & LOWE, P.C.

(57) ABSTRACT

A liquid cooling device includes a water cooling radiator, a first pump and a cold plate. The water cooling radiator has a first surface and a second surface, the first surface and the second surface are located on opposite sides of the water cooling radiator, the first pump is disposed on the first surface or the second surface of the water cooling radiator, and the cold plate is disposed on the second surface of the water cooling radiator.

19 Claims, 8 Drawing Sheets

(56) References Cited

U.S. PATENT DOCUMENTS

| | | | |
|---|---|---|---|
| 2019/0104641 A1* | 4/2019 | Fan | G06F 1/20 |
| 2019/0239388 A1* | 8/2019 | Tsai | H05K 7/20254 |
| 2019/0307019 A1* | 10/2019 | Nakae | H05K 7/20254 |
| 2020/0116430 A1* | 4/2020 | Nakae | F28F 1/325 |
| 2021/0048256 A1* | 2/2021 | Xiao | F28F 9/0202 |

* cited by examiner

LIQUID COOLING DEVICE

RELATED APPLICATIONS

This application claims priority to U.S. Provisional Application Ser. No. 63/280,870, filed Nov. 18, 2021 and U.S. Provisional Application Ser. No. 63/303,263, filed Jan. 26, 2022, the disclosures of which are incorporated herein by reference in their entireties.

TECHNICAL FIELD

The present disclosure generally relates to a liquid cooling device. More particularly, the present disclosure relates to a liquid cooling device of a display card.

BACKGROUND

With the advancement of technology, electronic products have become more popular, and gradually changed the life or work of many people. As the speed of the computers increases, the calculating power of the display cards becomes more and more powerful so that the temperature control of the electronic components such as the graphics processing units (GPUs) is more important.

Electronic components such as the graphics processing units generate heat during operation and require proper cooling to achieve the best performance. In order to keep the graphics processing unit and other electronic components operating at a proper temperature, a liquid cooling device or an air cooling device is usually used.

In the current water-cooling heat dissipation device, the working fluid flows into the cold plate through the pipeline, and the cold plate contacts the surface of the electronic component, e.g. the graphics processing unit, to take away the heat generated by the electronic component during operation, thereby reducing the operating temperature of the electronic component, and improving the working efficiency of the display cards.

Therefore, there is a need to improve the performance and efficiency of the water-cooling heat dissipation devices so as to improve the performance and efficiency of the display cards, which is also a challenge currently faced by those skilled in the art.

SUMMARY

One objective of the embodiments of the present invention is to provide a liquid cooling device to effectively improve the cooling efficiency thereof as well as effectively improve the performance and efficiency of the electronic devices such as the display cards.

To achieve these and other advantages and in accordance with the objective of the embodiments of the present invention, as the embodiment broadly describes herein, the embodiments of the present invention provides a liquid cooling device, a water cooling radiator, a first pump, and a cold plate. The water cooling radiator includes a first surface and a second surface, and the first surface and the second surface are respectively located on opposite sides of the water cooling radiator. The first pump is disposed on the first surface or the second surface of the water cooling radiator, and the cold plate is disposed on the second surface of the water cooling radiator.

In some embodiments, the water cooling radiator further includes a first water tank, a second water tank, a third water tank, a plurality of heat radiating fins and a plurality of water flow paths. The heat radiating fins are disposed between the first water tank, the second water tank and the third water tank, and the water flow paths pass through in the heat radiating fins.

In some embodiments, the liquid cooling device further includes a second pump, and the first pump is fixed and communicated with the first water tank and the second pump is fixed and communicated with the second water tank.

In some embodiments, the liquid cooling device further includes at least one cooling fan disposed on the first surface or the second surface of the water cooling radiator, and located adjacent to the first pump.

In some embodiments, the liquid cooling device further includes a first cooling fan and a second cooling fan. The first cooling fan is disposed on the first surface or the second surface of the water cooling radiator, and located adjacent to the first pump. In addition, the second cooling fan is disposed on the first surface or the second surface of the water cooling radiator, and located adjacent to the second pump.

In some embodiments, the first pump and the first cooling fan are disposed on the first surface of the water cooling radiator, and the second pump and the second cooling fan are also disposed on the first surface of the water cooling radiator.

In some embodiments, the first pump and the first cooling fan are disposed on the second surface of the water cooling radiator, and the second pump and the second cooling fan are also disposed on the second surface of the water cooling radiator.

In some embodiments, the first pump and the first cooling fan are disposed on the second surface of the water cooling radiator, and the second pump and the second cooling fan are disposed on the first surface of the water cooling radiator. In addition, two ends of the water cooling radiator include a step.

In some embodiments, the liquid cooling device further includes a third pump fixed and communicated with the third water tank. The first pump, the first cooling fan, the second pump, the second cooling fan and the third pump are disposed on the first surface of the water cooling radiator, and the first cooling fan is located between the first pump and the third pump, and the second cooling fan is located between the second pump and the third pump.

In some embodiments, the first pump is fixed and communicated with the third water tank, and the first pump is disposed on the first surface of the water cooling radiator, and located between a first cooling fan and a second cooling fan.

In some embodiments, the third water tank includes a first partition plate and a second partition plate. The second partition plate and the first partition plate separate the third water tank into three areas, wherein a first water inlet and a first water outlet of the cold plate are respectively connected to two corresponding areas of the three areas, and another area of the three areas is connected to the first pump and disconnected from the cold plate.

In some embodiments, the heat radiating fins include a plurality of first heat radiating fins, a plurality of second heat radiating fins and a plurality of third heat radiating fins. The second heat radiating fins are formed between the first heat radiating fins and the third heat radiating fins, and the first heat radiating fins, the second heat radiating fins and the third heat radiating fins have different intervals.

In some embodiments, an interval of the first heat radiating fins is smaller than an interval of the second heat radiating fins, and the interval of the second heat radiating fins is smaller than an interval of the third heat radiating fins.

In some embodiments, the cold plate is connected to the third water tank.

In some embodiments, the third water tank includes a first partition plate to separate the third water tank into two areas.

In some embodiments, the cold plate includes a first chamber and first skived fins. The first chamber includes a first water inlet and a first water outlet, and the first water inlet and the first water outlet are respectively connected to corresponding areas of the two areas of the third water tank. In addition, the first skived fins are disposed in the first chamber, and located between the first water inlet and the first water outlet.

In some embodiments, the third water tank further includes a second partition plate, and the second partition plate and the first partition plate are formed a cross partition plate to separate the third water tank into four areas. In addition, the cold plate further includes a second chamber, a chamber partition plate and second skived fins. The second chamber includes a second water inlet and a second water outlet, and the first water inlet, the first water outlet, the second water inlet and the second water outlet are respectively connected to corresponding areas of the four areas of the third water tank. The chamber partition plate is formed between the first chamber and the second chamber to isolate the first chamber and the second chamber. In addition, the second skived fins is disposed in the second chamber, and located between the second water inlet and the second water outlet.

Hence, the aforementioned liquid cooling device can provide a larger heat dissipation area of the water cooling radiator without increasing the length, width and height of the liquid cooling device, and further improve the heat dissipation efficiency of the liquid cooling device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
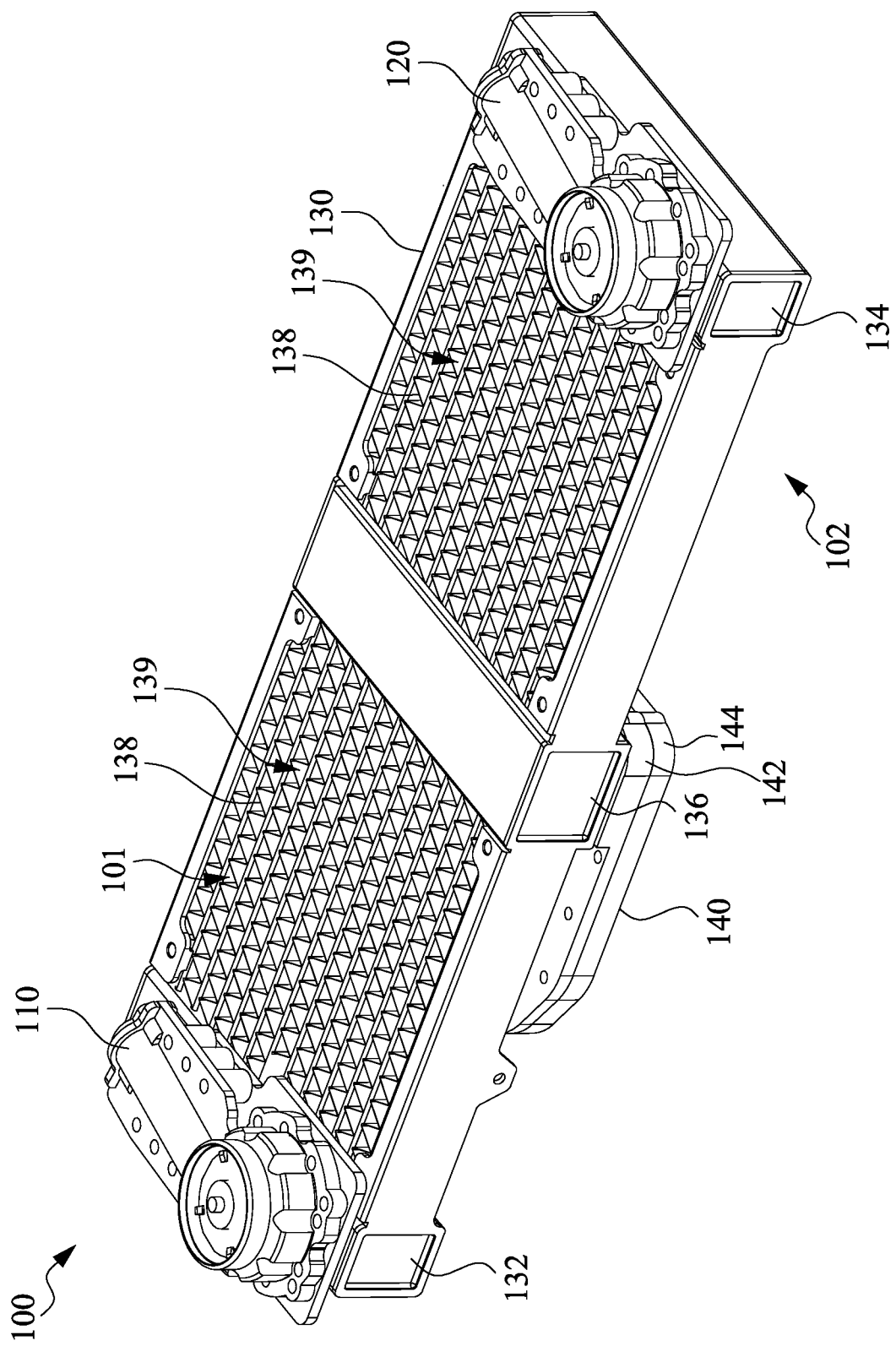
FIG. 1 illustrates a schematic view showing a liquid cooling device according to one embodiment of the present invention.
Figure 2:
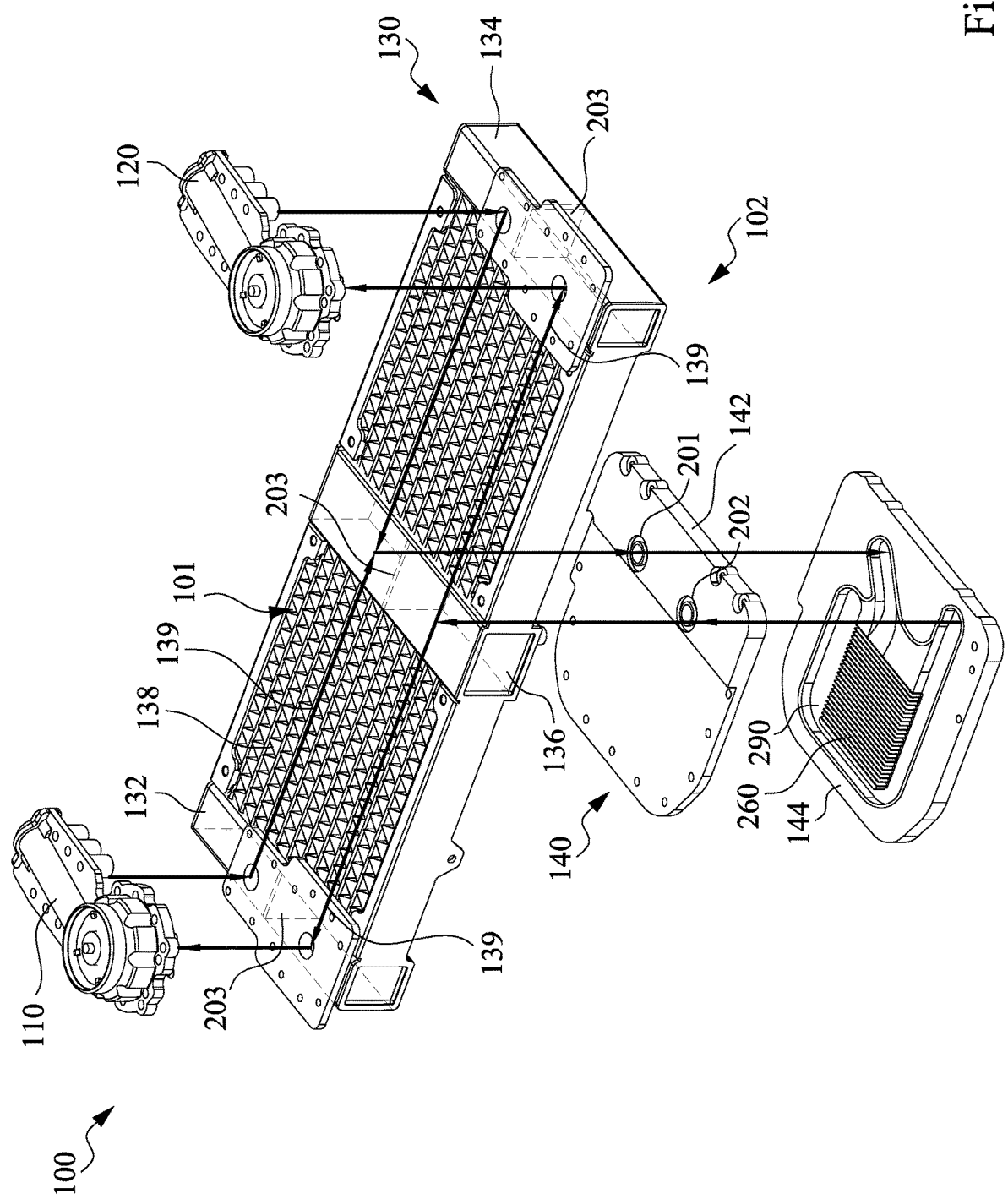
FIG. 2 illustrates a schematic exploded view of the liquid cooling device of FIG. 1.
Figure 3:
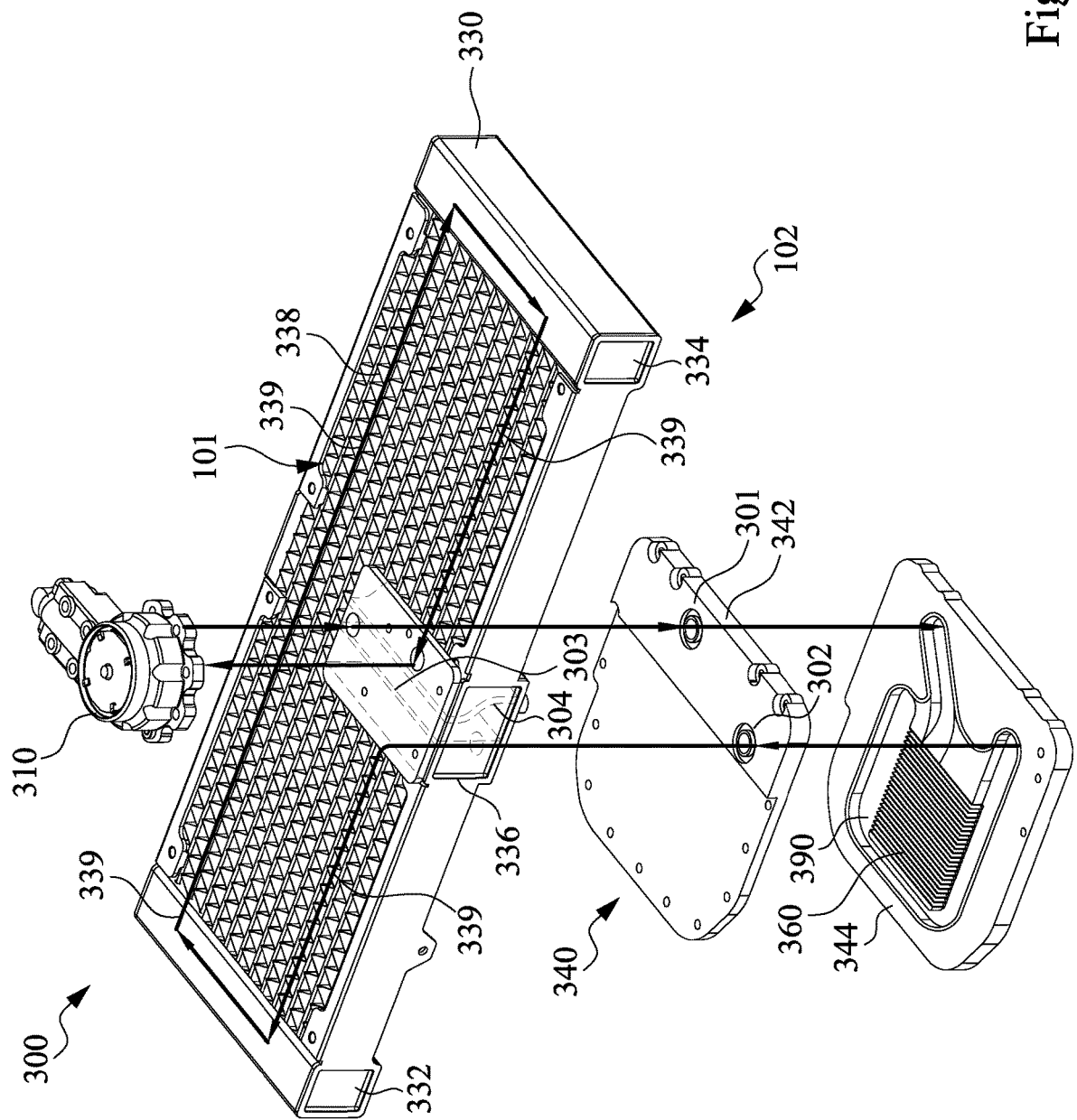
FIG. 3 illustrates a schematic exploded view showing a liquid cooling device according to another embodiment of the present invention.
Figure 4:
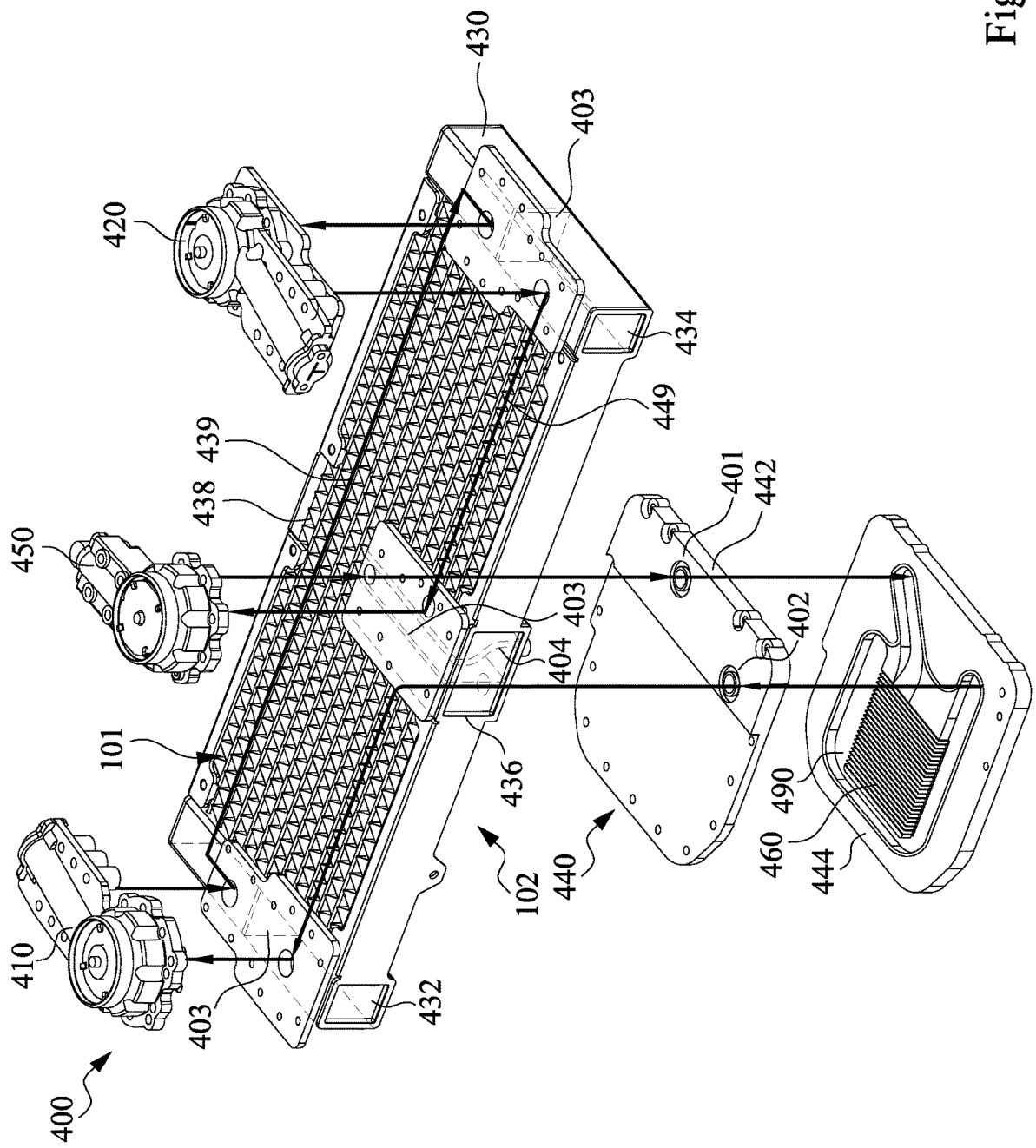
FIG. 4 illustrates a schematic exploded view showing a liquid cooling device according to further another embodiment of the present invention.
Figure 5:
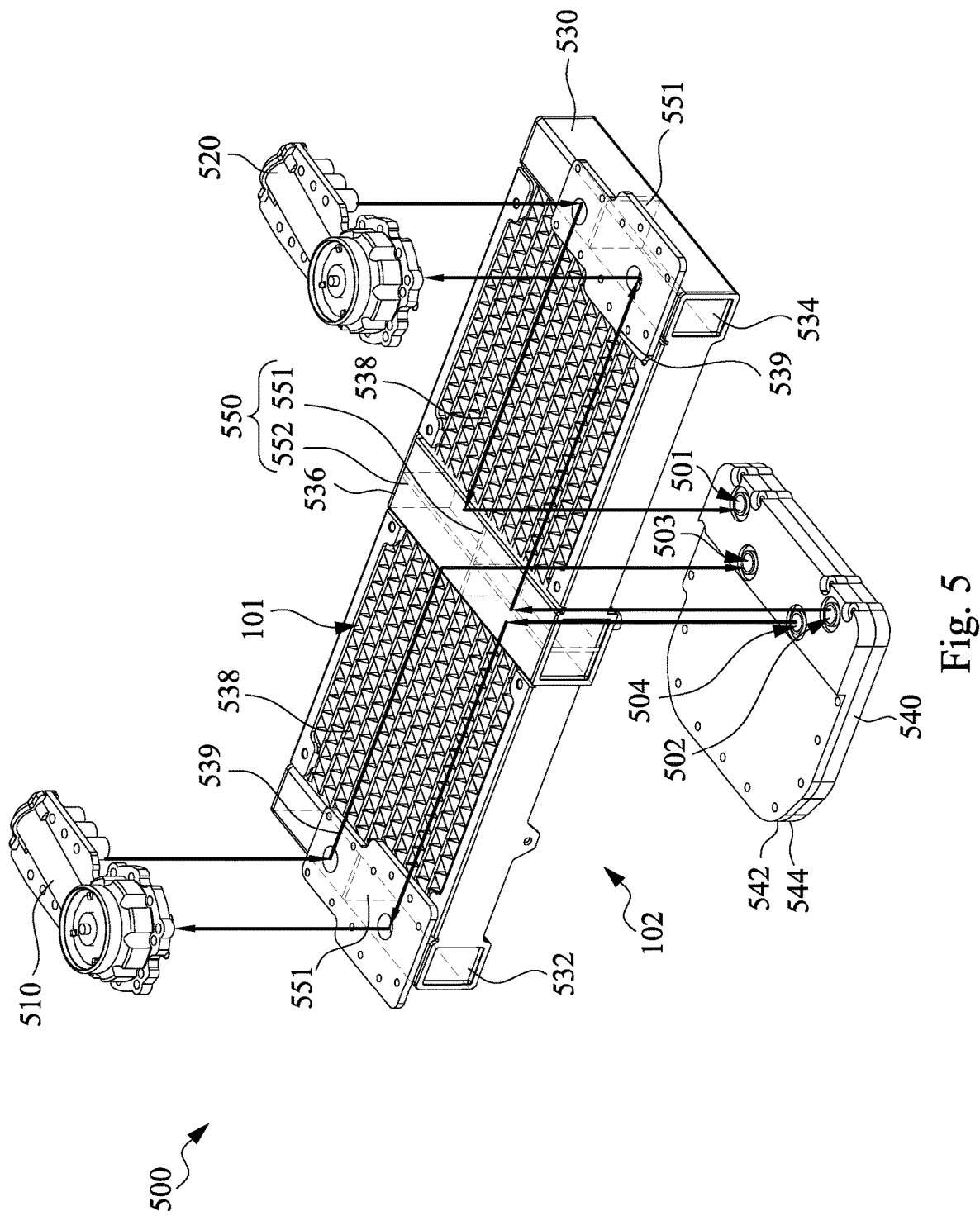
FIG. 5 illustrates a schematic exploded view showing a liquid cooling device according to still further another embodiment of the present invention.
Figure 6:
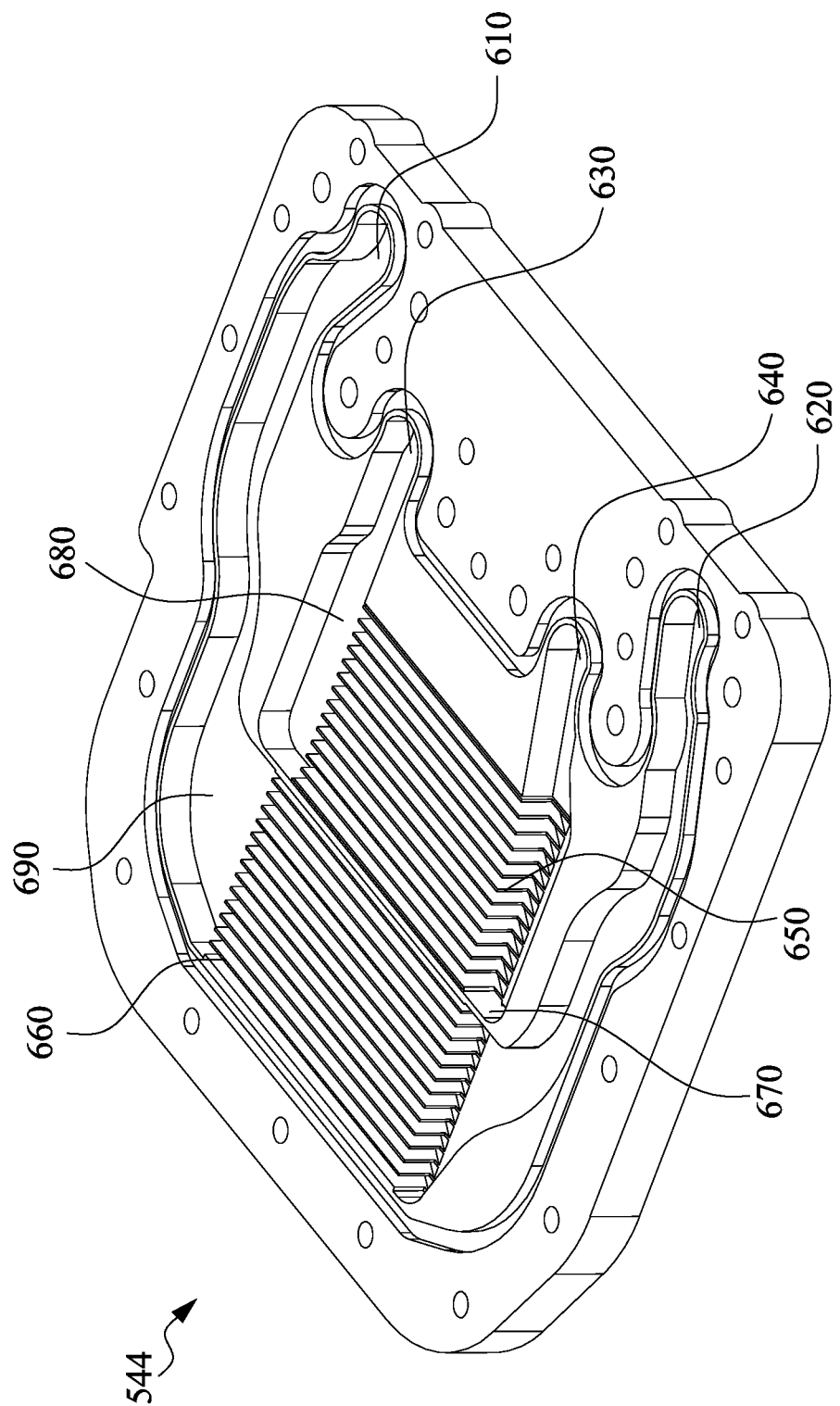
FIG. 6 illustrates a schematic view showing a bottom plate of a cold plate of the liquid cooling device of FIG. 5.
Figure 7:
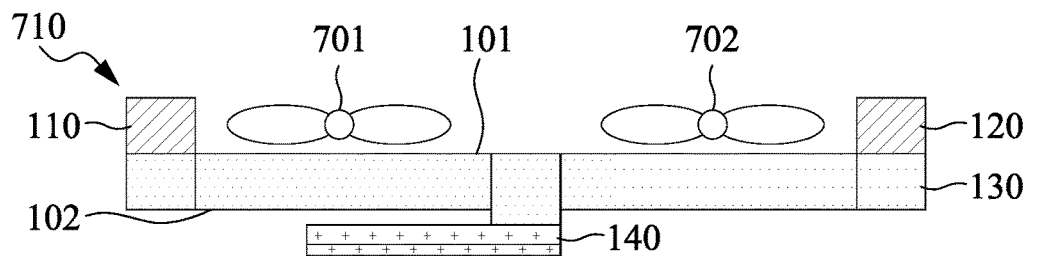
FIG. 7 illustrates a schematic view showing various configuration embodiments of cooling fans, water cooling radiators and pumps of the liquid cooling device.
Figure 7:
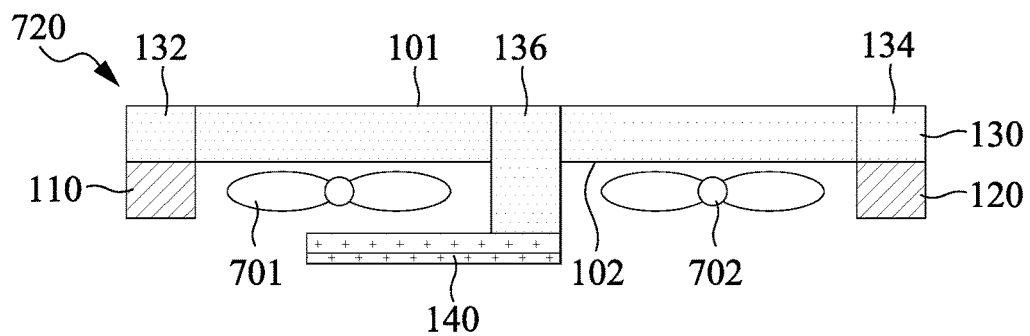
Figure 7:
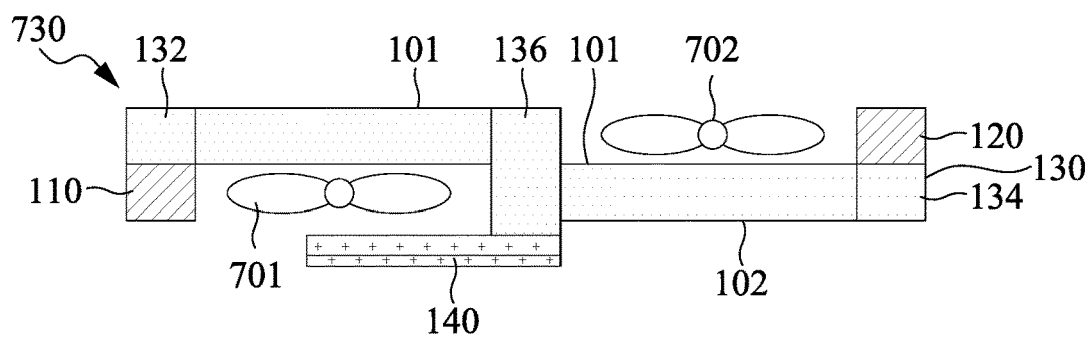
Figure 7:
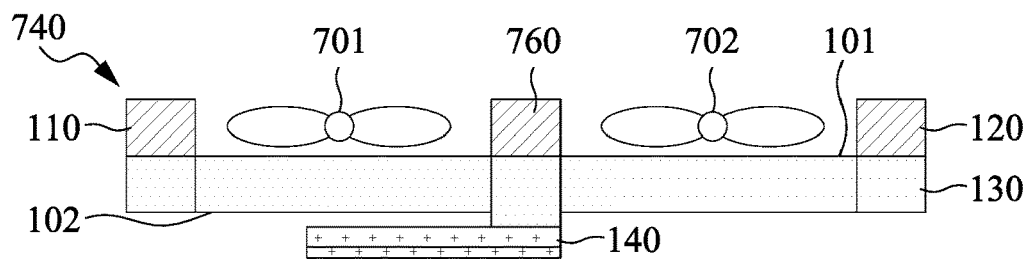
Figure 7:
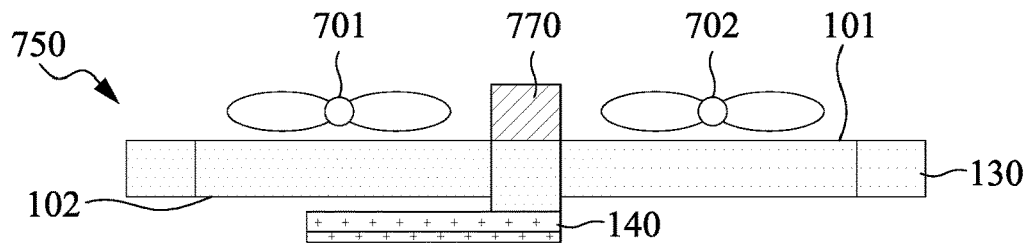
Figure 8:
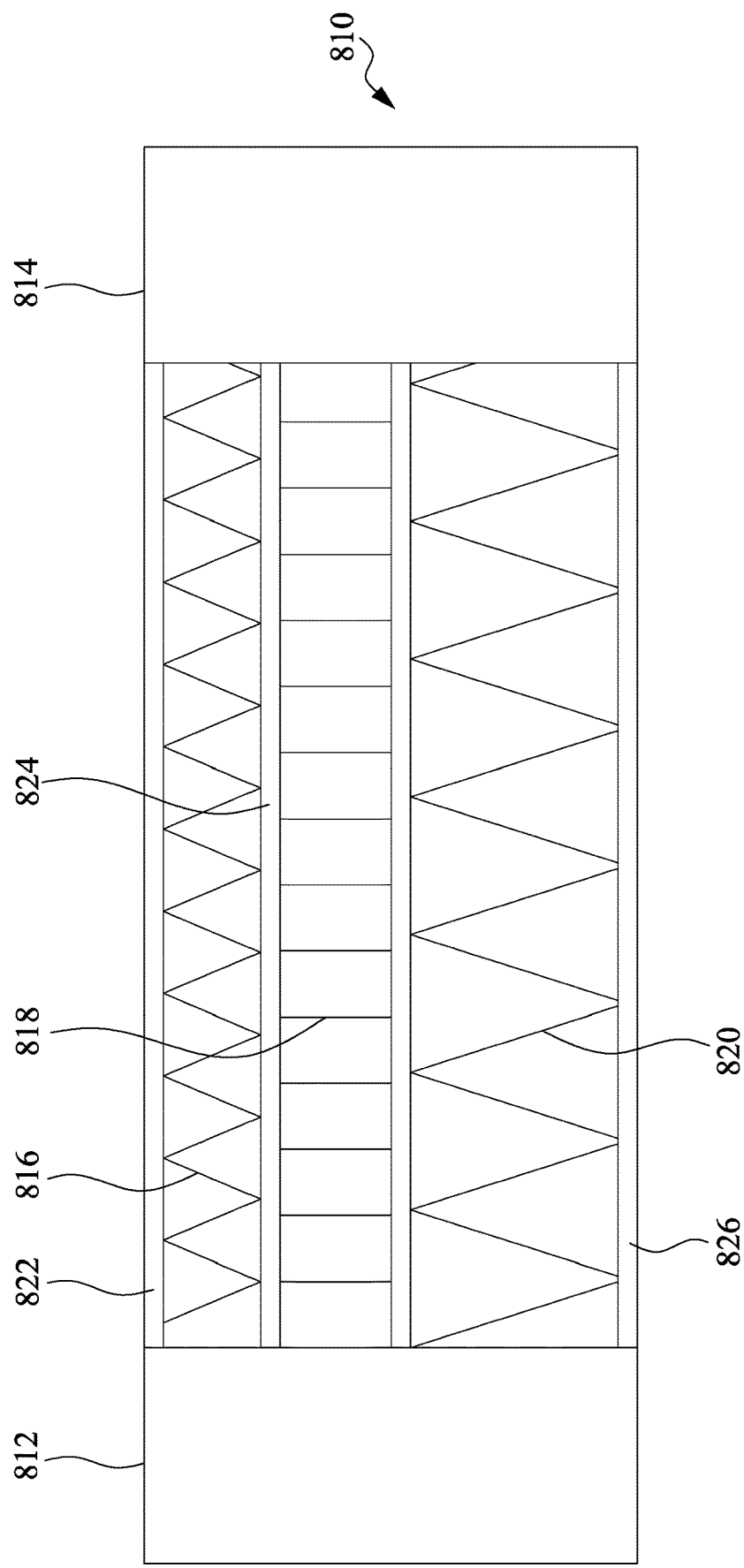
FIG. 8 illustrates a schematic view showing a water cooling radiator of a liquid cooling device according to one embodiment of the present invention.

FIG. 1 illustrates a schematic view of a liquid cooling device according to one embodiment of the present invention, and FIG. 2 illustrates a schematic exploded view thereof. FIG. 3 illustrates another embodiment of a liquid cooling device according to the present invention, FIG. 4 illustrates further another embodiment thereof, FIG. 5 illustrates still further another embodiment thereof, FIG. 6 illustrates a bottom plate of a cold plate of the liquid cooling device of FIG. 5. In addition, FIG. 7 illustrates various configuration embodiments of cooling fans, water cooling radiators and pumps of the liquid cooling device, and FIG. 8 illustrates another embodiment of the water cooling radiator of the liquid cooling device.

Refer to FIG. 1, the liquid cooling device 100 includes a water cooling radiator 130, at least one first pump 110 and a cold plate 140. The water cooling radiator 130 includes a first surface 101 and a second surface 102, and the first surface 101 and the second surface 102 are respectively located on opposite sides of the water cooling radiator 130. In addition, the cold plate 140 is disposed on the second surface 102 of the water cooling radiator 130. That is to say, the cold plate 140 is adjacent to the second surface 102 of the water cooling radiator 130, and the first surface 101 is another surface of the water cooling radiator 130 opposite to the cold plate 140.

In some embodiments, the first pump 110 is disposed on the first surface 101 of the water cooling radiator 130. In some embodiment, the first pump 110 can be disposed on the second surface 102 of the water cooling radiator 130, without departing from the spirit and scope of the present invention.

In some embodiments, the water cooling radiator 130 further includes a first water tank 132, a second water tank 134, a third water tank 136, a plurality of heat radiating fins 138 and a plurality of water flow paths 139. The first water tank 132 is disposed on the left side of the water cooling radiator 130 in FIG. 1, the second water tank 134 is disposed on the right side of the water cooling radiator 130, and the third water tank 136 is located between the first water tank 132 and the second water tank 134. The heat radiating fins 138 are disposed between the first water tank 132, the second water tank 134 and the third water tank 136, and the water flow paths 139 pass through in the heat radiating fins 138 so as to carry the heat in the working fluid through the water flow paths 139 to the heat radiating fins 138, and remove the heat by cooling fans.

In some embodiments, the water flow paths 139 are flat water flow pipes to increase the contact area with the heat radiating fins 138 and reduce the shading area affecting the heat radiating fins 138.

In some embodiments, the liquid cooling device 100 further includes a second pump 120, and the first pump 110 is fixed and communicated with the first water tank 132, and the second pump 120 is fixed and communicated with the second water tank 134.

Further refer to FIG. 2. The liquid cooling device 100 can utilize the first pump 110 to draw the hot water, exhausted from the cold plate 140, from the third water tank 136 through corresponding water flow paths 139, to reduce the temperature of the hot water with the heat radiating fins 138, then entering into the first water tank 132, passing through the first pump 110, the first water tank 132 and corresponding water flow paths 139 to further reduce the temperature thereof, and then re-entering the cold plate 140 through the third water tank 136 so as to dissipate the heat of the electronic components such as graphics chips.

The cold plate 140 includes a top cover 142 and a bottom plate 144, and a first water inlet 201 and a first water outlet 202 are formed on the top cover 142. The bottom plate 144 includes a first chamber 290 and first skived fins 260.

Similarly, the liquid cooling device 100 may further utilize the second pump 120 to draw the hot water, exhausted from the cold plate 140, from the third water tank 136, through the corresponding water flow paths 139, to reduce the temperature of the hot water with the heat radiating fins 138, then entering into the second water tank 134, passing through the second pump 120, the second water tank 134 and corresponding water flow paths 139 to further reduce the temperature thereof, and then re-entering the cold plate 140 through the third water tank 136 so as to dissipate the heat of the electronic components such as graphics chips.

That is to say, the first pump 110 located on the left side may draw the working fluid from the third water tank 136 to the first water inlet 201 through the water flow paths 139 passing through in the heat radiating fins 138, and draw the working fluid back from the first water outlet 202 to exchange the heat of the first skived fins 260 in the first chamber 290 so as to cool the electronic components such as graphics chips. In addition, the second pump 120 located on right side may draw the working fluid from the third water tank 136 to the first water inlet 201 through the water flow paths 139 passing through in the heat radiating fins 138, and draw the working fluid back from the first water outlet 202 to simultaneously exchange the heat of the first skived fins 260 in the first chamber 290 so as to further cool the electronic components such as graphics chips. The first water tank 132, the second water tank 134 and the third water tank 136 respectively include first partition plates 203 to respectively separate the first water tank 132, the second water tank 134 and the third water tank 136 into two areas.

Therefore, the liquid cooling device 100 may utilize the first pump 110 and the second pump 120 both disposed on the first surface 101 of the water cooling radiator 130 to cool the working fluid in two directions to effectively improve the heat dissipation efficiency of the liquid cooling device 100. In addition, the first pump 110 and the second pump 120 may not influence the length and width of the water cooling radiator 130 because that the first pump 110 and the second pump 120 are both disposed on the first surface 101 of the water cooling radiator 130.

Referring to FIG. 3, another embodiment of the liquid cooling device is illustrated. The liquid cooling device 300 includes a water cooling radiator 330, a first pump 310 and a cold plate 340. The cold plate 340 is disposed on a second surface 102 of the water cooling radiator 330. In addition, the first pump 310 is disposed on a first surface 101 of the water cooling radiator 330. The water cooling radiator 330 includes a first water tank 332, a second water tank 334, a third water tank 336, a plurality of heat radiating fins 338 and a plurality of water flow paths 339. The water flow paths 339 pass through in the heat radiating fins 338 and connect the first water tank 332, the second water tank 334 and the third water tank 336. The cold plate 340 and the first pump 310 are disposed on and communicate with the third water tank 336, the working fluid is circulated through the first pump 310, and the heat in the working fluid is transferred to the heat radiating fins 338, and then removed by the cooling fans.

The cold plate 340 includes a top cover 342 and a bottom plate 344, a first water inlet 301 and a first water outlet 302 formed on the top cover 342. The bottom plate 344 includes a first chamber 390 and first skived fins 360. In addition, the third water tank 336 includes a first partition plate 303 and a second partition plate 304 therein, and the first partition plate 303 and the second partition plate 304 separate the third water tank 336 into three areas.

That is to say, the first pump 310 disposed on the third water tank 336 located in the middle may draw the working fluid from a corresponding area of the third water tank 336 through the water flow paths 339, passing through in the heat radiating fins 338, to the first water inlet 301 of the cold plate 340 by way of another corresponding area of the third water tank 336, and then entering into the first chamber 390 to exchange the heat of the first skived fins 360 in the first chamber 390 so as to cool the electronic components such as graphics chips. Subsequently, the working fluid is transported to the first water outlet 302 of the cold plate 340, and draw back into further another corresponding area, corresponding to the first water outlet 302, of the third water tank 336. In addition, the working fluid is directly transported to the first water tank 332 through the water flow paths 339, passing through in the heat radiating fins 338, and transported to the second water tank 334 through the water flow paths 339, passing through in the heat radiating fins 338, and then returns back to the third water tank 336 through the water flow paths 339, passing through in the heat radiating fins 338. Further, the working fluid pumped by the first pump 310 is then transported to the cold plate 340 again.

That is to say, a first water inlet 301 and a first water outlet 302 of the cold plate 340 are respectively connected to two corresponding areas of the three areas of the third water tank 336, and another area is only connected to the inlet of the first pump 310 and is not directly connected to the cold plate 340. In addition, the first water inlet 301 of the cold plate 340 is communicated with the outlet of the first pump 310 through a corresponding area of the third water tank 336.

In addition, refer to FIG. 4, further another embodiment of the liquid cooling device is illustrated. The liquid cooling device 400 includes a water cooling radiator 430, a first pump 410, a second pump 420, a third pump 450 and a cold plate 440. The cold plate 440 is disposed on a second surface 102 of the water cooling radiator 430. The first pump 410, the second pump 420 and the third pump 450 is disposed on the first surface 101 of the water cooling radiator 430. In addition, the structure and function of the third pump 450 and the third water tank 436 are similar to those of the first pump 310 and the third water tank 336 as illustrated in FIG. 3. The structure and function of the first water tank 432 and the first pump 410 are similar to those of the first water tank 132 and the first pump 110 as illustrated in FIG. 2. The structure of the second water tank 434 and the second pump 420 is opposite to that of the first water tank 432 and the first pump 410. In addition, the structure and function of the heat radiating fins 438, the cold plate 440 and the water flow paths 439 are similar to those of the heat radiating fins 338, the cold plate 340 and the water flow paths 339 as illustrated in FIG. 3.

That is to say, a first partition plate 403 and a second partition plate 404 are formed in the third water tank 436, and the first partition plate 403 and the second partition plate 404 separate the third water tank 436 into three areas. In addition, the first water tank 432 and the second water tank 434 respectively include first partition plates 403 to respectively separate the first water tank 432 and the second water tank 434 into two areas.

In addition, the cold plate 440 includes a top cover 442 and a bottom plate 444. A first water inlet 401 and a first water outlet 402 are formed on the top cover 442. The bottom plate 444 includes a first chamber 490 and first skived fins 460.

Therefore, the liquid cooling device 400 may simultaneously utilize three pumps to increase the flow velocity and flow rate of the working fluid, and the heat dissipation efficiency of the liquid cooling device 400.

Referring to FIG. 5 and FIG. 6, still further another embodiment of the liquid cooling device is illustrated. The liquid cooling device 500 includes a water cooling radiator 530, a first pump 510, a second pump 520 and a cold plate 540. The cold plate 540 is disposed on the second surface 102 of the water cooling radiator 530. The first pump 510 and the second pump 520 are disposed on the first surface 101 of the water cooling radiator 530, but the present invention is not limited thereto.

The first pump 510 is fixed and communicated with the first water tank 532, and the second pump 520 is fixed and communicated with the second water tank 534. The third water tank 536 includes a cross partition plate 550 to separate the third water tank 536 into four areas respectively connecting to corresponding first water inlet 501, first water outlet 502, second water inlet 503 and second water outlet 504 of the cold plate 540. The cold plate 540 includes a top cover 542 and a bottom plate 544. The first water inlet 501, the first water outlet 502, the second water inlet 503 and the second water outlet 504 are formed on the top cover 542.

In some embodiments, the cross partition plate 550 includes a first partition plate 551 and a second partition plate 552. The second partition plate 552 is vertically cross-connected to the first partition plate 551 to form the cross partition plate 550, and separate the third water tank 536 into four areas. In addition, the first water tank 532 and the second water tank 534 respectively include first partition plates 551 to respectively separate the first water tank 532 and the second water tank 534 into two areas.

Referring to FIG. 6, the bottom plate 544 includes a first chamber 690, a second chamber 680, a chamber partition plate 670, first skived fins 660 and second skived fins 650. The first chamber 690 includes a first water entrance channel 610 and a first water exit channel 620, the second chamber 680 includes a second water entrance channel 630 and a second water exit channel 640 respectively corresponding to the first water inlet 501, the first water outlet 502, the second water inlet 503 and the second water outlet 504 of the top cover 542.

Therefore, the first water entrance channel 610, the first water exit channel 620, the second water entrance channel 630 and the second water exit channel 640 are respectively connected to corresponding areas of the third water tank 536. The chamber partition plate 670 is formed between the first chamber 690 and the second chamber 680 to separate the first chamber 690 and the second chamber 680, the first skived fins 660 are disposed in the first chamber 690 and located between the first water entrance channel 610 and the first water exit channel 620, and the second skived fins 650 is disposed in the second chamber 680 and located between the second water entrance channel 630 and the second water exit channel 640.

Therefore, the first pump 510 located on the left side may transport the working fluid to the second water inlet 503 through the water flow paths 539, passing through in the heat radiating fins 538, and the working fluid is drawn back from the second water outlet 504 to exchange the heat of the second skived fins 650 in the second chamber 680 on the right side so as to cool the electronic components such as graphics chips. In addition, the second pump 520 located on the right side may transport the working fluid to the first water inlet 501, and the working fluid is drawn back from the first water outlet 502 to exchange the heat of the first skived fins 660 of the first chamber 690 on the left side so as to cool the electronic components such as graphics chips. With two sets of skived fins, the heat dissipation efficiency of the liquid cooling device 500 can be further improved, and with two pumps located on the left and right sides, the heat exchange of the first skived fins 660 and the second skived fins 650 are performed respectively and may not interfere with each other and compete for the working fluid so as to provide more stable cooling capacity. In addition, the temperature distribution of the cold plate 540 may be adjusted to improve the cooling effect of the liquid cooling device 500 by adjusting the rotational speed and flow rate of the first pump 510 and the second pump 520 and/or the length and width of the first skived fins 660 and the second skived fins 650.

Referring to FIG. 7, various configuration embodiments of cooling fans, water cooling radiators and pumps of the liquid cooling device are illustrated. The liquid cooling device may install the pumps on the first surface 101 or the second surface 102, for example an air inlet surface or air outlet surface of the water cooling radiator 130, and the pumps are not installed on the side wall of the of the water cooling radiator 130 so as to provide a larger heat dissipation area of the water cooling radiator under a same length and width.

It is worth noting that the liquid cooling device may be equipped with a plurality of cooling fans on the first surface 101 or the second surface 102 of the water cooling radiator 130 so that the heights of the cooling fans and the pumps are shared on the water cooling radiator 130 and the overall height of the liquid cooling device may not be increased.

The configuration between the cooling fans, the water cooling radiator, the cold plate and the pumps of the liquid cooling device will be described in the following five configuration embodiments, but the present invention is not limited thereto.

First, a first configuration embodiment 710 is illustrated, a liquid cooling device includes a first cooling fan 701 disposed adjacent to the first pump 110, and a second cooling fan 702 disposed adjacent to the second pump 120. The first pump 110 and the first cooling fan 701 are disposed on the first surface 101 of the water cooling radiator 130, and the second pump 120 and the second cooling fan 702 are disposed on the first surface 101 of the water cooling radiator 130. The cold plate 140 is disposed on the second surface 102 of the water cooling radiator 130.

Further, in a second configuration embodiment 720, the first pump 110 and the first cooling fan 701 of the liquid cooling device are disposed on the second surface 102 of the water cooling radiator 130, and the second pump 120 and the second cooling fan 702 are disposed on the second surface 102 of the water cooling radiator 130. In addition, the cold plate 140 is disposed on the second surface 102 of the water cooling radiator 130, and is communicated with an enlarged third water tank 136. In addition, the volume of the third water tank 136 is greater than the volume of the first water tank 132 and the volume of the third water tank 136 is also greater than the volume of the second water tank 134 so that the storage volume of the liquid cooling device for storing the working fluid is increased without increasing the height of the liquid cooling device.

In a third configuration embodiment 730 of the liquid cooling device, the first pump 110 and the first cooling fan 701 are disposed on the second surface 102 of the water cooling radiator 130, and the second pump 120 and the second cooling fan 702 are disposed on the first surface 101 of the water cooling radiator 130. In addition, the cold plate 140 is disposed on the second surface 102 of the water cooling radiator 130, and is communicated with an enlarged third water tank 136. In addition, the volume of the third water tank 136 is greater than the volume of the first water tank 132 and the volume of the third water tank 136 is also greater than the volume of the second water tank 134 so that the storage volume of the liquid cooling device for storing the working fluid is increased without increasing the height of the liquid cooling device. Furthermore, since the first pump 110 and the first cooling fan 701 are disposed on the second surface 102 of the water cooling radiator 130, the second pump 120 and the second cooling fan 702 are disposed on the first surface 101 of the water cooling radiator 130, and the left end and the right end of the water cooling radiator 130 includes a step therebetween so that the water cooling radiator 130 may match the components on various printed circuit board products with different appearances to improve the application field of the liquid cooling device.

Furthermore, in a fourth configuration embodiment 740 of the liquid cooling device, the liquid cooling device includes a first cooling fan 701 disposed adjacent to the first pump 110, a second cooling fan 702 disposed adjacent to the second pump 120, and a third pump 760 fixed and communicated with the third water tank 436. The first pump 110, the first cooling fan 701, the second pump 120, the second cooling fan 702 and the third pump 760 are all disposed on the first surface 101 of the water cooling radiator 130, and the first cooling fan 701 is disposed between the first pump 110 and the third pump 760 and the second cooling fan 702 is disposed between the second pump 120 and the third pump 760. The cold plate 140 is disposed on the second surface 102 of the water cooling radiator 130. Therefore, the liquid cooling device may increase the flow velocity, the flow rate, and the heat dissipation capacity of the working fluid with more pumps.

Moreover, in a fifth configuration embodiment 750 of the liquid cooling device, the liquid cooling device is equipped with a single first pump 770 fixed and communicated with the third water tank 336. In addition, the first pump 770 is disposed on the first surface 101 of the water cooling radiator 130 and located between the first cooling fan 701 and the second cooling fan 702.

With the above-mentioned various configuration embodiments of the liquid cooling device, the pump may not affect the length, width and height of the liquid cooling device so as to maximize the dimensions of the water cooling radiator and improve the heat dissipation efficiency of the liquid cooling device.

In addition, FIG. 8 illustrates another embodiment of a water cooling radiator of a liquid cooling device. The water cooling radiator 810 includes a first water tank 812 and a second water tank 814, a plurality of first heat radiating fins 816, a plurality of second heat radiating fins 818 and a plurality of third heat radiating fins 820 are equipped between the first water tank 812 and the second water tank 814. The water flow path 822, the water flow path 824 and the water flow path 826 are respectively communicated with the first water tank 812 and the second water tank 814, and disposed in the first heat radiating fins 816, the second heat radiating fins 818 and the third heat radiating fins 820 to remove the heat of the working fluid flowing in the water flow path 822, the water flow path 824 and the water flow path 826 with the first heat radiating fins 816, the second heat radiating fins 818 and the third heat radiating fins 820. It is worth noting that the second heat radiating fins 818 are formed between the first heat radiating fins 816 and the third heat radiating fins 820, and the first heat radiating fins 816, the second heat radiating fins 818 and the third heat radiating fins 820 respectively include different intervals.

In some embodiments, the interval of the first heat radiating fins 816 is smaller than the interval of the second heat radiating fins 818, and the interval of the second heat radiating fins 818 is smaller than the interval of the third heat radiating fins 820 so that the liquid cooling device may adjust the interval of the heat radiating fins to increase the heat dissipation efficiency of the liquid cooling device and reduce the working noise of the liquid cooling device according to the heat dissipation requirement of the liquid cooling device and the air intake of the cooling fan.

Accordingly, the liquid cooling device of the present invention can provide a larger heat dissipation area of the water cooling radiator without increasing the length, width and height of the liquid cooling device, and further improve the heat dissipation efficiency of the liquid cooling device.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A liquid cooling device, comprising:
   a water cooling radiator, comprising a first surface and a second surface, the first surface and the second surface respectively located on opposite sides of the water cooling radiator;
   a first pump disposed on the first surface or the second surface of the water cooling radiator;
   a cold plate disposed on the second surface of the water cooling radiator,
   wherein the water cooling radiator further comprises:
   a first water tank;
   a second water tank;
   a third water tank;
   a plurality of heat radiating fins disposed between the first water tank, the second water tank and the third water tank;
   a plurality of water flow paths passing through in the heat radiating fins; and
   at least one cooling fan disposed on the first surface or the second surface of the water cooling radiator, and located adjacent to the first pump.

2. The liquid cooling device of claim 1, further comprising a second pump, wherein the first pump is fixed and communicated with the first water tank and the second pump is fixed and communicated with the second water tank.

3. The liquid cooling device of claim 2, further comprising:
   a first cooling fan disposed on the first surface or the second surface of the water cooling radiator, and located adjacent to the first pump; and
   a second cooling fan disposed on the first surface or the second surface of the water cooling radiator, and located adjacent to the second pump.

4. The liquid cooling device of claim 3, wherein the first pump and the first cooling fan are disposed on the first surface of the water cooling radiator, and the second pump and the second cooling fan are also disposed on the first surface of the water cooling radiator.

5. The liquid cooling device of claim 3, wherein the first pump and the first cooling fan are disposed on the second surface of the water cooling radiator, and the second pump and the second cooling fan are also disposed on the second surface of the water cooling radiator.

6. The liquid cooling device of claim 3, wherein the first pump and the first cooling fan are disposed on the second surface of the water cooling radiator, and the second pump and the second cooling fan are disposed on the first surface of the water cooling radiator.

7. The liquid cooling device of claim 6, wherein two ends of the water cooling radiator comprises a step.

8. The liquid cooling device of claim 3, further comprising a third pump fixed and communicated with the third water tank.

9. The liquid cooling device of claim 8, wherein the first pump, the first cooling fan, the second pump, the second cooling fan and the third pump are all disposed on the first surface of the water cooling radiator, and the first cooling fan is located between the first pump and the third pump, and the second cooling fan is located between the second pump and the third pump.

10. The liquid cooling device of claim 1, wherein the first pump is fixed and communicated with the third water tank.

11. The liquid cooling device of claim 10, wherein the third water tank comprises:
a first partition plate; and
a second partition plate, wherein the second partition plate and the first partition plate separate the third water tank into three areas, wherein a first water inlet and a first water outlet of the cold plate are respectively connected to two corresponding areas of the three areas, and another area of the three areas is connected to the first pump and disconnected from the cold plate.

12. The liquid cooling device of claim 10, wherein the first pump is disposed on the first surface of the water cooling radiator, and located between a first cooling fan and a second cooling fan.

13. The liquid cooling device of claim 1, wherein the heat radiating fins comprise:
a plurality of first heat radiating fins;
a plurality of second heat radiating fins; and
a plurality of third heat radiating fins, wherein the second heat radiating fins are formed between the first heat radiating fins and the third heat radiating fins, and the first heat radiating fins, the second heat radiating fins and the third heat radiating fins have different intervals.

14. The liquid cooling device of claim 13, wherein an interval of the first heat radiating fins is smaller than an interval of the second heat radiating fins, and the interval of the second heat radiating fins is smaller than an interval of the third heat radiating fins.

15. The liquid cooling device of claim 1, wherein the cold plate is connected to the third water tank.

16. The liquid cooling device of claim 15, wherein the third water tank comprises a first partition plate to separate the third water tank into two areas.

17. The liquid cooling device of claim 16, wherein the cold plate comprises:
a first chamber comprising a first water inlet and a first water outlet, wherein the first water inlet and the first water outlet are respectively connected to corresponding areas of the two areas of the third water tank; and
first skived fins disposed in the first chamber, and located between the first water inlet and the first water outlet.

18. The liquid cooling device of claim 17, wherein the third water tank further comprises a second partition plate, and the second partition plate and the first partition plate are formed a cross partition plate to separate the third water tank into four areas.

19. The liquid cooling device of claim 18, wherein the cold plate further comprises:
a second chamber comprising a second water inlet and a second water outlet, wherein the first water inlet, the first water outlet, the second water inlet and the second water outlet are respectively connected to corresponding areas of the four areas of the third water tank;
a chamber partition plate formed between the first chamber and the second chamber to isolate the first chamber and the second chamber; and
second skived fins disposed in the second chamber, and located between the second water inlet and the second water outlet.

* * * * *